United States Patent [19]

Bierhenke et al.

[11] 4,264,915
[45] Apr. 28, 1981

[54] CHARGE-COUPLED COMPONENT FORMED ON GALLIUM ARSENIDE

[75] Inventors: Hartwig Bierhenke, Grafing; Walter Kellner, Putzbrunn; Hermann Kniepkamp, Munich, all of Fed. Rep. of Germany

[73] Assignee: Siemens Aktiengesellschaft, Berlin & Munich, Fed. Rep. of Germany

[21] Appl. No.: 935,532

[22] Filed: Aug. 21, 1978

[30] Foreign Application Priority Data

Sep. 26, 1977 [DE] Fed. Rep. of Germany ....... 2743245

[51] Int. Cl.³ .................... H01L 29/78; H01L 29/56; G11C 19/28
[52] U.S. Cl. ........................................ 357/24; 357/15; 357/89; 307/221 D
[58] Field of Search ................. 357/15, 24; 307/221 D

[56] References Cited

U.S. PATENT DOCUMENTS

| | | | |
|---|---|---|---|
| 3,700,932 | 10/1972 | Kahng | 357/24 |
| 3,739,240 | 6/1973 | Krambeck | 357/24 |
| 3,965,481 | 6/1976 | Esser | 357/24 |
| 3,986,197 | 10/1976 | Ablassmeier | 357/24 |
| 4,012,759 | 3/1977 | Esser | 357/24 |
| 4,032,952 | 6/1977 | Ohba et al. | 357/24 |
| 4,151,539 | 4/1979 | Barron et al. | 357/24 |

OTHER PUBLICATIONS

LeHovec et al., "Mobility Dopant and Carrier Distributions at the Interface between Semiconducting and Semi-insulating Gallium Arsenide", Inst. Phys. Conf., Ser. No. 24 (1975) Chap. 5, pp. 292-306.
Kellner et al., "Schottky-Barrier on GaAs", IEEE Int. Electron Devices Meeting (12/77), paper 24.7, pp. 599-600.
Deyhimy et al., "GaAs Charge-Coupled Devices", Applied Physics Lett. vol. 32 (Mar. 15, 1978) pp. 383-385.
Hinken, "Increased Signal Speed by GaAs CCD's", AEU Band. 29 (1975) pp. 286-288.
Schuermeyer et al., "New Structures for Charge-Coupled Devices", Proc. IEEE vol. 60 (11/72) pp. 1444-1445.
Hughes, et al., "A CCD on Gallium Arsenide", Int. Conf. Technology and Applications Charge Coupled Devices, Edinburgh (9/74), Proc. pp. 270-273.
Esser, "Peristatic Charge-Coupled Device: A New Type of Charge-Transfer Device", Electronics Letters vol. 8 (12/72) pp. 620-621.
Walden, et al., "The Buried Channel Charge Coupled Device", Bell System Tech. Journal vol. 51 (9/72) pp. 1635-1640.
Tuyl et al., "High-Speed Integrated Logic with GaAs MESFET's", IEEE J. Solid-State Circuits vol. SC-9 (10/74) pp. 269-276.

*Primary Examiner*—Gene M. Munson
*Attorney, Agent, or Firm*—Hill, Van Santen, Steadman, Chiara & Simpson

[57] ABSTRACT

The invention relates to a charge coupled element in which electrodes with blocking properties, arranged in series, are located on a semiconductor member of gallium arsenide. The semiconductor member has a semi-insulating gallium arsenide substrate on which an n-conductive layer of gallium arsenide is formed, which n-conductive layer has a charge carrier concentration of $1 \cdot 10^{15}$ through $5 \cdot 10^{17}$ cm$^{-3}$. The electrodes form a blocking transition with this n-conductive layer.

16 Claims, 5 Drawing Figures

CHARGE-COUPLED COMPONENT FORMED ON GALLIUM ARSENIDE

INTRODUCTION

The invention relates to a charge-coupled component having electrodes which are arranged in series and which have blocking properties. The semiconductor body on which they are formed is composed of gallium arsenide.

BACKGROUND OF THE INVENTION

Various proposals have been made in publications to use gallium arsenide as semiconductor material for charge coupled components (CCD). Due to the fact that charge carriers in gallium arsenide exhibit a higher degree of mobility and a higher diffusion coefficient in comparison to silicon, charge-coupled components of this type on gallium arsenide can be expected to display shorter charge transport times than charge-coupled elements constructed on silicon (AEU, Vol. 29, 1975, Vol. 6, page 286 to 288). It has been proposed that charge-coupled components of this type constructed as gallium arsenide CCDs should be designed not in the manner of MOS-capacitors, but that Schottky contacts be provided as electrodes (Proc. of the IEEE, November 1972, page 1444 to 1445; Proc. of the Intern. Conf. on Technology and Applications of Charge-Coupled Devices, Edinburgh September 1974, page 270 to 273). In accordance with these proposals, the principle of a peristaltic CCD is employed for components of this type (Electronic Letters 8, December 1972, Page 620 to 621) or Bulk Channel CCD (Bell System Technical Journal, September 1972, page 1635 to 1640). Here majority charge carriers, for example, electrons, are transported in an n-conducting zone. When a blocking voltage is connected between a p-conducting substrate and the n-conducting layer, a potential well in which a charge is stored is formed in the n-conducting zone. The use of a p-substrate for charge-coupled components constructed on gallium arsenide has the disadvantage, however, that the read-out and amplifier circuits required for the signal processing become relatively slow due to the parasitic capacitance of the pn-junction prevailing between the n-conducting layer and the p-conducting substrate, and that consequently the speed advantages gained on account of the higher degree of mobility of the charge carriers in the gallium arsenide, are lost.

Currently, charge-coupled elements with silicon semi-conductors operate throughout with MOS-capacitors. It has previously been impossible to successfully transfer this principle to charge-coupled elements constructed on gallium arsenide due to the fact that the boundary surface between GaAs and a dielectric arranged beneath a CCD electrode does not exhibit the requisite low energy level density. As a result, it is not possible to influence the space charge zone width in the GaAs in the desired manner or to produce inversion layers on the semiconductor surface. A further outcome of the excessively high energy level density is the frequency dependency which can be observed in MIS structures constructed on GaAs and the hysteresis of the capacitance which has a disadvantageous influence upon the operation of CCD circuits.

SUMMARY OF THE INVENTION

An object of the present invention is, in a charge-coupled component (CCD) on a GaAs semiconductor, a construction in which the higher degree of mobility of the charge carriers in GaAs, in comparison to silicon, can also be employed in order to achieve a greater charge transport speed between the CCD electrodes. In particular, with respect to the production process is compatible with the MESFET technique employed in GaAs components (IEEE Journal of Solid-State Circuits, SC-9, No. 5, October 1974, pages 269–276), so that charge-coupled components of this type can also be used to construct high-speed peripheral elements for CCD circuits in integrated fashion.

This object is attained by a charge-coupled component as hereinafter described in detail.

In accordance with the invention, the active part of the charge-coupled component is arranged in an n-conducting GaAs layer which is applied to a semi-insulating gallium arsenide substrate and to a GaAs layer which is more weakly n-doped than the active layer and which is itself arranged upon a semi-insulating GaAs substrate. A construction of this kind has the advantage that no pn-boundary layer to the substrate exists which can disadvantageously influence the charge transport time of the charge-coupled component as a result of its parasitic capacitance. This advantage is also favorable in peripheral circuits for signal processing which are conventionally produced together with the CCD on the same chip.

Other advantages consist in the compatibility of the production process with the conventional technology for the production of field effect transistors on GaAs and the simple structure which does not require critical adjustment or etching processes.

In accordance with an embodiment of the invention, Schottky contacts which can easily be produced are provided for the CCD electrodes. Al or layer sequences (TiPtAu, WPtAu) can be used as material for Schottky contacts of this kind. In accordance with another embodiment of the charge-coupled component corresponding to the invention, the CCD electrodes consist of flat, p+ doped zones within the n doped GaAs layer. In comparison to a design in which Schottky contacts are used for the CCD-electrodes, the use of p+ contacts of this type has the advantage that the diodes of the CCD can be operated with a higher voltage range in the flow direction and that lower blocking currents occur. The depth of the p+ doped zones amounts to up to 500 nm, preferably approximately 100 nm.

In accordance with another embodiment of the charge-coupled component corresponding to the invention, between the semi-insulating substrate and the n-doped layer which represents the active layer of the component, there is arranged a further, low-doped n-conducting layer. An intermediate layer of this type reduces the influence of low-lying traps which can occur at the boundary surface to the semi-insulating substrate. Traps of this kind can have a disadvantageous influence in that they result in an incomplete charge transport between the individual CCD electrodes and increased noise. The thickness of the weakly n-doped intermediate layer between the semi-insulating substrate and the n-doped active layer amounts, for example to 3 $\mu$m.

BRIEF DESCRIPTION OF THE DRAWINGS

In the following, the invention will be represented and explained in detail, making reference to exemplary embodiments shown by the Figures.

DESCRIPTION OF THE PREFERRED EMBODIMENTS

Figure 1:
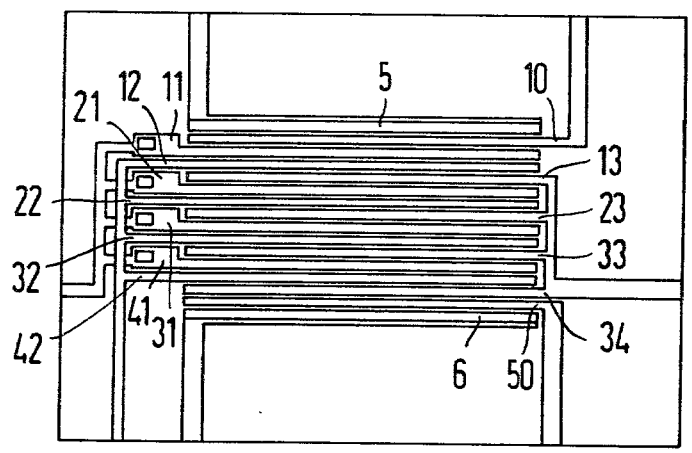
FIG. 1 illustrates a layout of a 3-phase, 4-stage CCD as an exemplary embodiment.

FIG. 1 schematically illustrates a lay-out for a charge-coupled component in accordance with the invention. This consists of an input electrode 5 and an output electrode 6 composed of GeAuCrAu (layer sequence), which form an ohmic junction with the semiconductor which is composed of GaAs. The electrode 5 is followed by an input electrode 10 which serves to control the charge transport out of the terminal electrode 5 into the CCD. The terminal electrode 10 is followed by a series of further electrodes 11, 12, 13; 21, 22, 23; 31, 32, 33; 41, 42, 43, which represent those electrodes of the CCD between which charge is displaced in accordance with the pulse train program. The charge-coupled component is a 3-phase CCD having four stages, so that the same timing pulse is applied to the electrodes 11, 21, 31, 41, to the electrodes 12, 22, 32, 42 and to the electrodes 13, 23, 33, 43. Accordingly, these electrodes possess a common drive line. The last shift electrode 43 of the CCD is followed, before the output electrode 6, by a further electrode 50 which serves to control the withdrawal of charge from the CCD.

Figure 2:
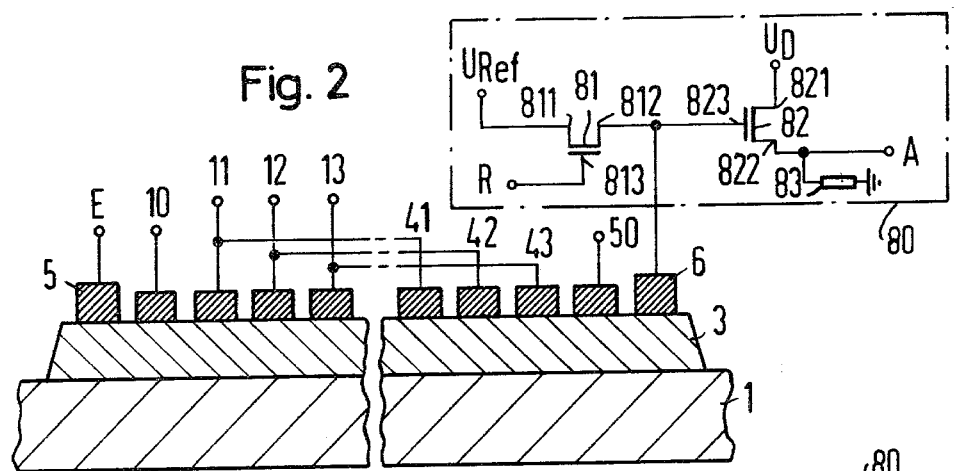
FIGS. 2 to 4 schematically illustrate exemplary embodiments of charge-coupled components in accordance with the invention.

FIG. 2 schematically illustrates a first exemplary embodiment of a charge-coupled component in accordance with the invention. This consists of a semi-insulating gallium arsenide substrate 1 to which is applied an n-conducting layer 3 having a doping of $(N_D - N_A) - 1 \cdot 10^{17}$ cm$^{-3}$ and a thickness d of approximately 0.2 μm. Here $N_D$ signifies the donor density and $N_A$ the acceptor density. This layer 3 can be applied for example, as an epitaxial layer from which individual islands, each containing a CCD circuit, are then etched. At the edge of the CCD electrodes there is arranged an input electrode 5 and an output electrode 6, which form block-free contacts with the layer 3. Of the shift electrodes of a 4-stage CCD, FIG. 2 illustrates only the electrodes 11, 12, 13 of the first stage and 41, 42, 43 of the last stage. In the exemplary embodiment illustrated in FIG. 2, these shift electrodes consist of Schottky contacts. They consist, for example, of Al or TiPtAu electrodes arranged on the layer 3. Between the input terminal electrode 5 and the first shift electrode 11, there is arranged a further electrode 10 which is likewise designed as a Schottky contact and which serves to control the supply of charge into the first stage of the CCD, and at the output between the last electrode 43, the last fourth stage and the output terminal 6, there is likewise arranged a further Schottky electrode 50 which serves to control the withdrawal of charge from the last stage. The output electrode 6 is connected to a read-out circuit 80 which consists of the two field effect transistors 81, 82 and a resistor 83. The field effect transistor 82 forms a source follower with the resistor 83 which is connected to earth on one side and on the other side is connected to the source electrode 822 of this field effect transistor. The output A of the read-out circuit is connected to the source electrode 822. The drain electrode 821 of this field effect transistor 82 is connected to a supply voltage $U_D$. The gate electrode of this field effect transistor 82 is connected to the output electrode 6 of the CCD. When charges arrive at the output electrode 6, the potential of the gate electrode 823 of the field effect transistor 82 is changed so that the transistor 82 switches on and a voltage jump occurs at the output A. In order to be able to reset the gate electrode 823 of the field effect transistor 82, this gate electrode is connected to the drain electrode 812 of the other field effect transistor 81. The source electrode 811 of this field effect transistor 81 is connected to a reference voltage source $U_{Ref}$. The resetting operation is controlled via the gate electrode 813 of the field effect transistor 81 by means of a resetting pulse R. This resetting pulse R serves to open the field effect transistor 81 and thus to connect the gate electrode 823 and the terminal electrode 6 of the CCD to the reference potential. Thus, at the end of the resetting pulse R, the terminal electrode 6 and the gate electrode 823 of the field effect transistor 82 are brought into a state which facilitates a re-evaluation of the charges arriving from the CCD at the terminal electrode 6.

Figure 3:
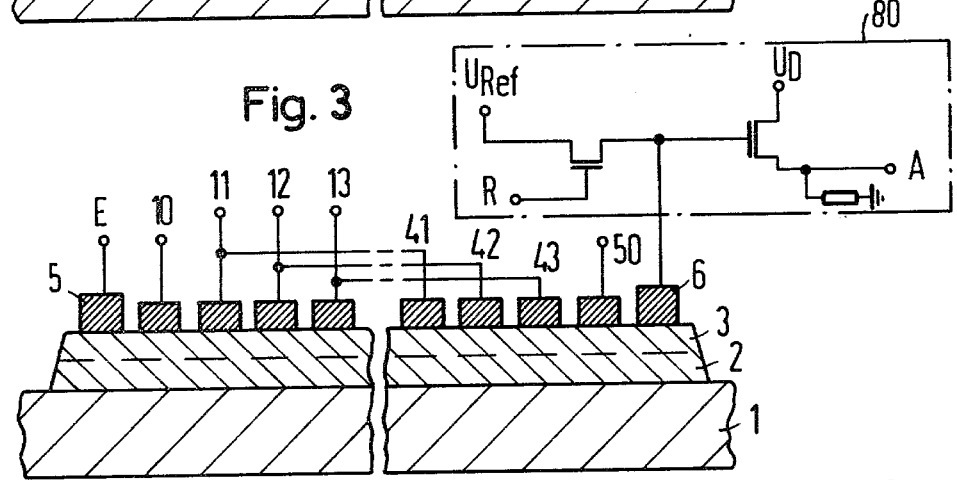

FIG. 3 illustrates a further exemplary embodiment of a charge-coupled component in accordance with the invention which fundamentally corresponds to the embodiment illustrated in FIG. 2. However, in contrast to the exemplary embodiment in FIG. 2, a further layer 2 which is more weakly n-conducting than the layer 3 is arranged between the semi-insulating substrate 1 and the n-conducting layer 3. This layer 2 has a charge carrier concentration of $< 10^{13}$ cm$^{-3}$ and a thickness of 3000 nm, for example. The layer 2 can, for example, be produced together with the layer 3 in that an epitaxial layer having the charge carrier concentration provided for the layer 2 is deposited upon the semi-insulating gallium arsenide substrate 1. Then, for example, employing ion implantation, that part of this epitaxial layer which is provided for the layer 3 more strongly doped so that the provided charge carrier concentration of approximately $1 \cdot 10^{17}$ cm$^{-3}$ is achieved. The introduction of the lower-doped layer 2 between the semi-insulating substrate and the layer 3 which is active for the CCD reduces the disadvantageous influence of low traps which can occur at the boundary surface between the semi-insulating substrate and the epitaxial layer deposited upon the latter upon the function of the CCD. Traps of this kind prove disadvantageous as they result in incomplete charge transport and increased noise in the CCD.

With regard to the arrangement of the electrodes and the read-out circuit, the information already given in respect of the exemplary embodiment illustrated in FIG. 2 also applies to the exemplary embodiment illustrated in FIG. 3.

Figure 4:
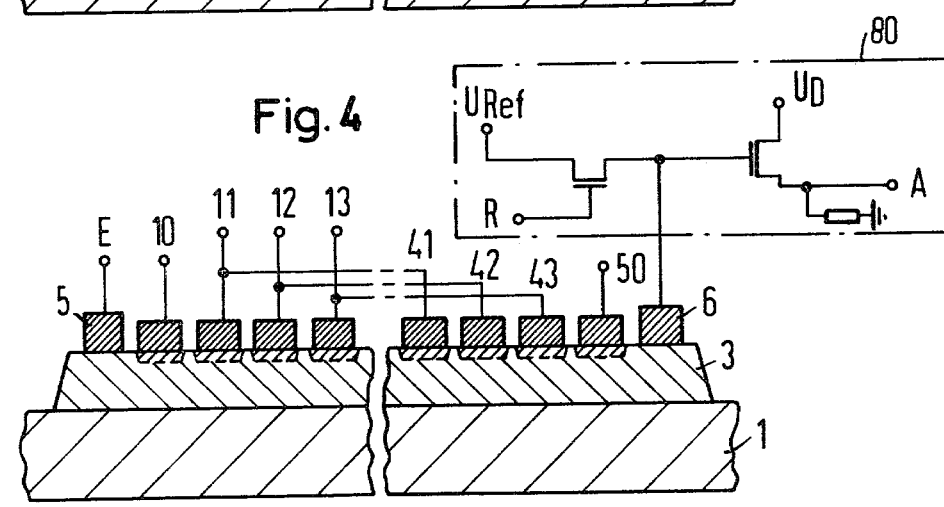

FIG. 4 illustrates another exemplary embodiment of a charge-coupled component in accordance with the invention. In this example, the CCD-electrodes are not Schottky contacts, but in fact are p+ doped contacts provided as the electrodes of the CCD. These p+ doped contacts consist of p+ doped zones 101, 111, 121, 131, 411, 421, 431, 501, which, for example, extend to a depth of 100 nm into the n doped layer 3. Then terminal electrodes which consist, for example, of TiPtAu are arranged upon these p+ doped zones. The use of p+ contacts of this kind in place of Schottky contacts results in the fact that the diodes formed from these p+ doped zones and the n-conducting layer 3 can be operated in the flow direction with an increased voltage range and lower blocking currents than diodes which are composed of Schottky contacts. With regard to the drive and the function of the individual electrodes and the read-out circuit, the information already given in respect of the exemplary embodiment in FIG. 2 applies to the exemplary embodiment in FIG. 4.

Figure 5:
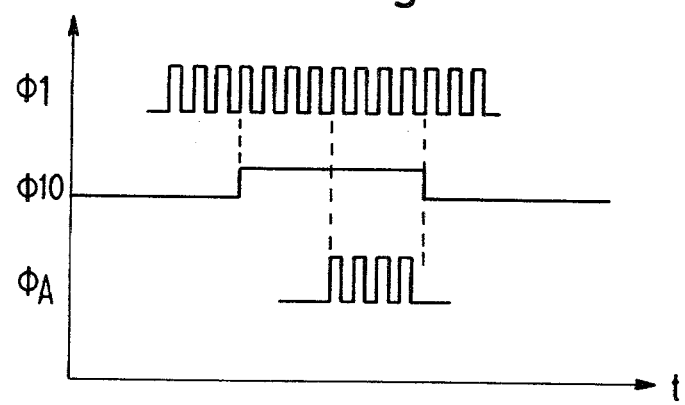
FIG. 5 schematically illustrates the course of pulse train voltages connected to the electrodes of the CCD and of the output voltage $\phi_A$.

FIG. 5 represents an example of a pulse train program for a charge-coupled component in accordance with the invention. $\phi_1$ designates timing pulses which are connected to the electrodes 11, 21, 31, 41 of the 3-phase, 4-stage CCD which has been selected as an example. $\phi_{10}$ designates a pulse applied to electrode 10 which serves to open the input of the CCD so that charges can flow out of the input electrode 5 into the CCD. $\phi_A$ designates pulses which occur at the output A of the read-out circuit. In the selected example of a 3-phase, 4-stage CCD in accordance with the number of stages, four timing pulses $\phi_1$ are required, in order that, when the CCD-input has been opened by the pulse $\phi_{10}$, individual charge parcels can be transported through the individual stages so that with a fifth timing pulse $\phi_1$ a first pulse $\phi_A$ appears at the output A of the read-out circuit.

In the illustrated exemplary embodiment, the length of the individual electrodes in the direction of shift of the CCD amounts, for example, to 5 $\mu$m, the distance (gap width) between the individual electrodes amounts to 2 $\mu$m, and the gate width (at right angles to the direction of shift) amounts to approximately 200 $\mu$m. The thickness and the doping of the n-layer have been selected to be such that when a voltage $V_P$ is connected between the input electrode 5 and the electrodes (10 to 50) which produce the charge shift, the n-conducting layer 3 is evacuated of electrons. The voltage $V_P$ can vary between approximately $-10$ V and 0 V. In the illustrated exemplary embodiment $V_P = -2$ V has been selected. When all the electrodes of the CCD are connected to the voltage $V_P$, the entire n-conducting layer 3 is evacuated. If the voltage across the electrodes 10 and 11 is increased, electrons flow from the terminal contact 5 into the semiconductor zone beneath the gate electrodes 10 and 11. When the voltage $V_P$ is reconnected to the electrode 10, an electron parcel is thus stored beneath the electrode 11. If the voltage across the electrode 12 is now increased and the voltage across the electrode 11 is reduced, the electrons present in the zone beneath the electrode 11 flow into the zone beneath the electrode 12. The electron parcel is forwarded in a similar manner from the electrode 12 to the electrode 13, from the electrode 13 to the electrode 21, and so on until, at the output behind the electrode 50, it reaches the second ohmic contact 6 which is connected to the read-out circuit.

It will be apparent to those skilled in the art that many modifications and variations may be effected without departing from the spirit and scope of the novel concepts of the present invention.

We claim as our invention:

1. A charge-coupled element comprising a semiconductor semi-insulating GaAs substrate, an n-conducting layer composed of GaAs on said substrate, said n-conducting GaAs having a charge carrier concentration of $1 \cdot 10^{15}$ to $5 \cdot 10^{17}$ cm$^{-3}$, and a series of electrodes on said n-conducting layer which form a blocking junction with said n-conducting layer.

2. A charge-coupled component as claimed in claim 1, in which said electrodes are Schottky electrodes.

3. A charge-coupled element as claimed in claim 2, in which said Schottky electrodes consist of Al.

4. A charge-coupled element as claimed in claim 2, in which said Schottky electrodes consist of TiPtAu in a layered structure.

5. A charge-coupled element as claimed in claim 2, in which said Schottky electrodes consist of WPtAu in a layered structure.

6. A charge-coupled element as claimed in claim 1, in which said electrodes have strongly p-doped zones which are arranged on the surface of said n-conducting layer on which said electrodes are arranged.

7. A charge-coupled element as claimed in claim 6, in which said strongly p-doped zones extend to a depth of approximately 500 nm, into the n-conducting layer.

8. A charge-coupled element as claimed in claim 6, in which said strongly p-doped zones extend to a depth of approximately 100 nm, into the n-conducting layer.

9. A charge-coupled element as claimed in claim 1, in which at least one additional electrode which is non-blocking in comparison to the n-conducting layer is arranged at the beginning and at the end of the series of electrodes.

10. A charge-coupled element as claimed in claim 1, in which the distance between said electrodes amounts to between 0.5 and 2.5 $\mu$m.

11. A charge-coupled element as claimed in claim 1, in which the width of said electrodes in the transverse direction to the direction of the series of electrodes amounts to approximately 200 $\mu$m.

12. A charge-coupled element as claimed in claim 1, in which the length of each of said electrodes amounts to approximately 5 $\mu$m.

13. A charge-coupled element as claimed in claim 1, in which the thickness of said n-conducting layer amounts to approximately 0.2 $\mu$m.

14. A charge-coupled element as claimed in claim 1, in which said n-conducting layer is doped with at least one of the elements of the group containing sulphur, selenium, silicon and tin.

15. A charge-coupled element as claimed in claim 1, in which said n-conducting layer exhibits a dopant concentration of between $1 \cdot 10^{15}$ and $5 \cdot 10^{17}$ cm$^{-3}$.

16. A charge-coupled element as claimed in claim 1, in which a further, relatively weakly n-doped layer having a charge carrier concentration of less than $10^{13}$ cm$^{-3}$ is formed between said semi-insulating substrate and said n-conducting layer.

* * * * *